United States Patent
Lee et al.

(10) Patent No.: US 11,774,531 B1
(45) Date of Patent: Oct. 3, 2023

(54) SYSTEMS, ASSEMBLIES, AND METHODS OF SUPPRESSING MAGNET-GRADIENT INTERACTION IN MAGNETIC RESONANCE SYSTEMS

(71) Applicant: GE PRECISION HEALTHCARE LLC, Wauwatosa, WI (US)

(72) Inventors: Seung-Kyun Lee, Cohoes, NY (US); Yihe Hua, Rexford, NY (US)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 0 days.

(21) Appl. No.: 17/736,538

(22) Filed: May 4, 2022

(51) Int. Cl.
*G01R 33/42* (2006.01)
*G01R 33/421* (2006.01)
*G01R 33/385* (2006.01)

(52) U.S. Cl.
CPC ....... *G01R 33/4215* (2013.01); *G01R 33/385* (2013.01)

(58) Field of Classification Search
CPC .......................... G01R 33/4215; G01R 33/385
See application file for complete search history.

(56) References Cited

U.S. PATENT DOCUMENTS

| | | | |
|---|---|---|---|
| 5,680,046 A * | 10/1997 | Frederick | G01R 33/422 324/318 |
| 6,501,275 B1 | 12/2002 | Westphal | |
| 6,552,543 B1 | 4/2003 | Dietz | |
| 6,707,302 B2 | 3/2004 | Ries | |
| 7,514,928 B2 | 4/2009 | Westphal | |
| 7,535,225 B2 | 5/2009 | Dietz et al. | |
| 8,319,588 B2 | 11/2012 | Calvert | |
| 8,410,777 B2 | 4/2013 | Aubert | |
| 10,416,254 B2 | 9/2019 | Laskaris et al. | |
| 2008/0157771 A1 * | 7/2008 | Westphal | G01R 33/3804 324/319 |

* cited by examiner

*Primary Examiner* — G. M. A Hyder
(74) *Attorney, Agent, or Firm* — Armstrong Teasdale LLP

(57) ABSTRACT

A magnetic resonance (MR) system is provided. The system includes a main magnet assembly configured to generate a polarizing magnetic field, a gradient coil assembly including a plurality of gradient coils configured to apply at least one gradient field to the polarizing magnetic field, and a shield assembly positioned between the main magnet assembly and the gradient coil assembly. The shield assembly includes a conductive layer fabricated with an electrically conductive material and defining grooves positioned through the conductive layer, wherein the grooves are configured to block motional eddy currents caused by actions of the polarizing magnetic field and the at least one gradient field when the at least one gradient field is applied.

20 Claims, 7 Drawing Sheets

SYSTEMS, ASSEMBLIES, AND METHODS OF SUPPRESSING MAGNET-GRADIENT INTERACTION IN MAGNETIC RESONANCE SYSTEMS

BACKGROUND

The field of the disclosure relates generally to systems and methods of magnet assemblies, and more particularly, to systems, assemblies, and methods of suppressing magnet-gradient interaction in magnetic resonance (MR) systems.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Stable magnetic field is fundamental to the performance of an MR system. Rapid switching of strong gradient coils generate leakage magnetic field, which causes induced eddy currents that in turn generate motional eddy currents. Motional eddy currents pose serious risk of heating and quench to the magnet of the MR system. Motion-induced amplification of the interaction between the magnet and gradient coils may be referred to as magnet-gradient interaction (MGI). Known systems and methods of managing MGI are disadvantaged in some aspects and improvements are desired.

BRIEF DESCRIPTION

In one aspect, a magnetic resonance (MR) system is provided. The system includes a main magnet assembly configured to generate a polarizing magnetic field, a gradient coil assembly including a plurality of gradient coils configured to apply at least one gradient field to the polarizing magnetic field, and a shield assembly positioned between the main magnet assembly and the gradient coil assembly. The shield assembly includes a conductive layer fabricated with an electrically conductive material and defining grooves positioned through the conductive layer, wherein the grooves are configured to block motional eddy currents caused by actions of the polarizing magnetic field and the at least one gradient field when the at least one gradient field is applied.

In another aspect, a shield assembly of an MR system is provided. The shield assembly includes a conductive layer fabricated with an electrically conductive material and defining grooves positioned through the conductive layer, wherein the grooves are configured to block motional eddy currents generated by the MR system.

In one more aspect, a method of assembling a shield assembly of an MR system is provided. The method includes providing a conductive layer fabricated with an electrically conductive material and defining grooves positioned through the conductive layer, wherein the grooves are configured to block motional eddy currents generated by the MR system.

DRAWINGS

Non-limiting and non-exhaustive examples are described with reference to the following figures, wherein like reference numerals refer to like parts throughout the various drawings unless otherwise specified.

DETAILED DESCRIPTION

The disclosure includes systems, assemblies, and methods of reducing motional eddy currents in a magnetic resonance (MR) system. Motional eddy currents pose serious risk of magnet heating and quench, especially for compact, high-performance, high field scanners. Superconducting magnet assemblies of MR systems are described as examples for illustration purposes only. The systems, assemblies, and methods may be applied to any magnet assemblies in any systems such as permanent magnet assemblies because heating from motional eddy currents causes magnetic field drift in the magnet assemblies, compromising the performance of the magnet assemblies. Method aspects will be in part apparent and in part explicitly discussed in the following description.

In magnetic resonance imaging (MRI), a subject is placed in a magnet. As used herein, a subject is a human, an animal, or a phantom, or part of a human, an animal, or a phantom, such as an organ or tissue. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as Bo and extends in the longitudinal or z direction. In acquiring an MRI image, a magnetic field (referred to as an excitation field Bi), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal Bi is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject may be derived by reconstructing the MR signals.

Figure 1:
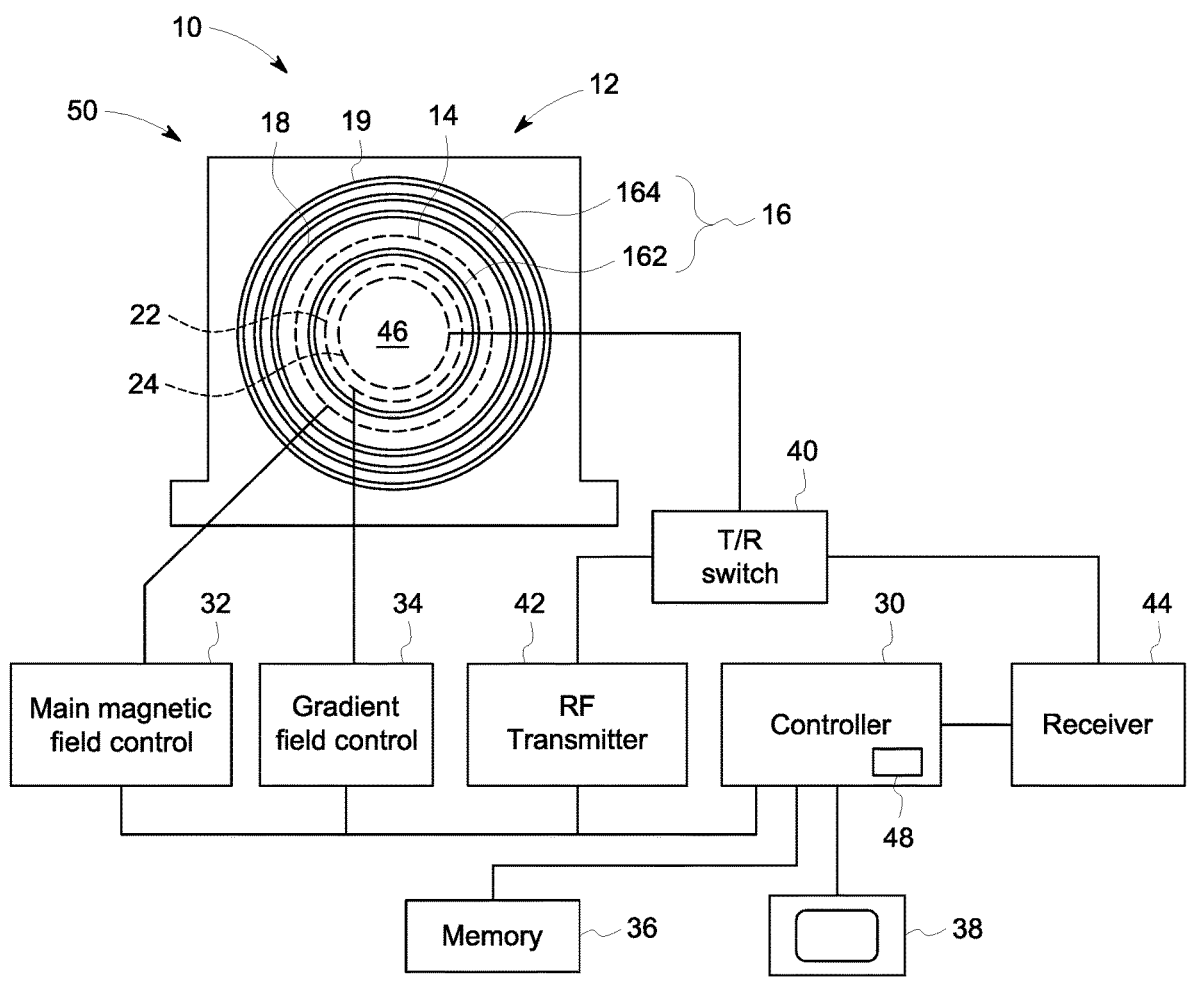
FIG. 1 is a schematic diagram of an exemplary magnetic resonance (MR) system.

FIG. 1 illustrates a schematic block diagram of an exemplary MR system 10. MR system 10 is used to obtain images or for spectroscopy applications of a subject.

In the exemplary embodiment, MR system 10 includes a main magnet assembly 12 that includes a main magnet 14. In some embodiments, main magnet 14 is a superconducting magnet formed from a plurality of magnetic coils wound around a magnetic coil support or a coil former. Main magnet 14 is configured to generate a polarizing magnetic field. In other embodiments, main magnet 14 is a permanent magnet. Main magnet assembly 12 may include a cryostat vessel 18 that surrounds main magnet 14. Cryostat vessel 18 is typically filled with a cryogenic fluid, such as liquid helium and/or nitrogen, which is used to cool the superconducting coils into an extremely low temperature, e.g., 4K, such that electric current continues to flow through the superconducting coils without electrical resistance to maintain a uniform and static main magnetic field after a power supply is disconnected.

In the exemplary embodiment, main magnet assembly 12 may also include a thermal shield assembly 16 that enclose cryostat vessel 18 and main magnet 14 therein. In one embodiment, thermal shield assembly 16 may include an inner thermal shield member 162 and an outer thermal shield member 164. Inner thermal shield member 162 is generally cylindrical in shape and is radially placed inside of main magnet 14. Inner thermal shield member 162 is configured to prevent heat being radiated from a warm region where the subject is placed to a cold region where main magnet 14 is placed. Outer thermal shield member 164 is arranged concentrically with respect to inner thermal shield member 162. Outer thermal shield member 164 may also have a generally cylindrical shape and is radially placed outside of main magnet 14. Outer thermal shield member 164 is configured to prevent heat being radiated from environment into main magnet 14. In some embodiments, thermal shield assembly 16 is made from metal materials, such as aluminum, which may generate eddy currents due to interaction with a changing electromagnetic field. In one embodiment, one type of the changing electromagnetic field is generated by one or more gradient coils by pulsed current signals. In some embodiments, main magnet assembly 12 may also include a magnet vacuum vessel 19 surrounding thermal shield assembly 16 and insulating main magnet 14 from the environment during operation.

In the exemplary embodiment, MR system 10 also includes a gradient coil assembly 22 placed inside of inner thermal shield member 162. Gradient coil assembly 22 is configured to selectively impose one or more gradient magnetic fields along one or more axes, such as x, y, or z axes. In some embodiments, gradient coil assembly 22 has shielded or unshielded configurations. As used herein, "shielded configuration" refers to a configuration where one or more shielding gradient coils are provided to generate opposing magnetic fields to cancel or reduce fringe fields produced by normal gradient coils. Gradient coil assembly 22 may include an x-axis gradient coil, which is configured to impose x-axis gradient fields along x-axis direction in response to pulsed current signals supplied thereto. Gradient coil assembly 22 may also include a y-axis gradient coil, which is configured to impose y-axis gradient fields along y-axis direction in response to pulsed current signals supplied thereto. Gradient coil assembly 22 may also include a z-axis gradient coil, which is configured to impose z-axis gradient fields along z-axis direction in response to pulsed current signals supplied thereto. An x-axis, y-axis, or z-axis gradient coil may be referred to as an x, y, or z gradient coil, respectively. The gradient fields generated by gradient coil assembly 22 allow spatial information of radio-frequency signals emanated from excited nuclei inside the subject to be identified.

In the exemplary embodiment, MR system 10 also includes RF coil 24. RF coil 24 shown in FIG. 1 is a body coil. RF coil 24 may be a local coil that may be placed in proximity to the anatomy to be imaged, or a coil array that includes a plurality of coils. RF coil 24 may be a transmitter coil, which is configured to transmit RF pulses. RF coil 24 may be a receiver coil, which is configured to detect MR signals from the subject. RF coil 24 may be a transmit and receive coil that transmits and also detect MR signals.

Main magnet assembly 12, gradient coil assembly 22, and body RF coil 24 are typically collectively referred to the magnet, and as used herein, are collectively referred to as a magnet assembly 50, because magnet assembly 50 forms into one unit that has magnetic field. Magnet assembly 50 has a bore 46, where the subject is positioned during scanning. Magnet assembly 50 shown in FIG. 1 is a closed bore system, where the bore is cylindrical. A closed-bore magnet assembly 50 is described herein as an example for illustration purposes. Magnet assembly 50 may be magnet assemblies of other designs, such as an open system or an open-bore system, a dipolar electromagnet configuration, or a Hallbach configuration.

In the exemplary embodiment, MR system 10 also includes a controller 30, a main magnetic field control 32, a gradient field control 34, a memory 36, a display device 38, a transmit/receive (T/R) switch 40, an RF transmitter 42, and a receiver 44. In operation, a subject is placed in bore 46 on a suitable support, for example, a motorized table (not shown) or other patient table. Main magnet 14 produces a uniform and static main magnetic field BO across bore 46. Strength and homogeneity of the main magnet field BO in bore 46 and correspondingly in patient is controlled by controller 30 via main magnetic field control 32, which also controls a supply of energized current to main magnet 14. Gradient coil assembly 22 is energized by gradient field control 34 and is also controlled by controller 30, so that one or more gradient magnetic fields are imposed on the main magnetic field BO. RF coil 24 and a receive coil, if provided, are selectively interconnected to one of RF transmitter 42 or receiver 44, respectively, by T/R switch 40. RF transmitter 42 and T/R switch 40 are controlled by controller 30 such that RF field pulses or signals are generated by RF transmitter 42 and are selectively applied to the subject for excitation of magnetic resonance in the subject.

In the exemplary embodiment, following application of the RF pulses, T/R switch 40 is again actuated to decouple RF transmit coil 24 from RF transmitter 42. The detected MR signals are in turn communicated to controller 30 which may organize the MR signals in a particular format for storage in memory 36. Controller 30 includes a processor 48 that controls the processing of the MR signals to produce signals representative of an image of the patient. The processed signals representative of the subject are transmitted to display device 38 to provide a visual display of the image.

Fast and strong gradient coils in MRI generate substantial magnetic leakage field outside the coils that induces eddy currents and heating in the surrounding magnet structures. In the presence of a strong static magnetic field (BO) of the MR system, eddy currents cause vibration of the magnet's conductive layers due to the Lorentz force, which in turn generates motional eddy currents that may be much larger than the original eddy currents. Motional eddy currents exacerbates electromagnetic interaction between the gradient coils and the magnet, posing serious risk of magnet heating and quench, especially for compact, high-performance, high-field scanners. The motion-induced amplification of the interaction may be referred to as magnet-gradient interaction (MGI).

Known MGI reduction methods focus on suppressing motion of the conductive structures that are located between the gradient coil and the magnet coil. However, suppressing vibration of conductive structures in a high-field environment is costly in terms of mechanical designs and material choices (e.g., bimetals or carbon fibers).

Systems, assemblies, and methods described herein address MGI by targeting motional eddy currents directly using shield assemblies, instead of focusing on reducing mechanical vibration of the conductive structures. For example, shield assemblies includes grooves/slots of certain patterns cut out of a conductive layer, where the grooves are configured to (i) allow induced eddy currents to flow relatively easily, while (ii) blocking the paths for motional eddy currents to flow on the conductive layer. The conductive layer having the designed pattern may be referred to as a non-motional eddy current (NME) layer. As a result, even if the conductive structures vibrate, there will be little motional eddy currents to enhance heating of the magnet. The conductive layer may be thin copper or aluminum backed by fiberglass, incurring relatively little additional cost for magnet construction. The systems, assemblies, and methods described herein are advantageous because the NME layer provides a path for the non-motional or induced eddy currents to flow, which protects the magnet from the leakage field of the gradient coil, while in the meantime limiting or blocking motional eddy currents, even if conductive structures vibrate in a high-BO environment. Unlike known methods, vibrations are not restricted and motional eddy currents are suppressed via cut-out patterns in the conductive layer, thereby obviating the need of stiffening of the structures in a magnet assembly. Further, unlike in known methods, where motional eddy currents are reduced by restricting applications that cause the magnet assembly to vibrate at certain resonance frequencies, the systems, assemblies, and methods described herein do not place restrictions on applications, thereby enhancing the performance of the MR system and fully reaching the potential of high gradient systems. High gradient power sequences may be applied without limiting sequence parameters such as echo spacing, resolution, gradient amplitude, or slew rates. Moreover, systems, assemblies, and methods described herein effectively reduce motional eddy currents in MR systems of high field strength, such as 7T, which has an increased risk of magnet heating and quench due to increased Lorentz force and motional eddy currents from the increased field strength. MGI effects are major risk for high-field systems. Therefore, systems, assemblies, and methods described herein are advantageous in reducing risks in heating and quench in high-field systems.

Figure 2A:
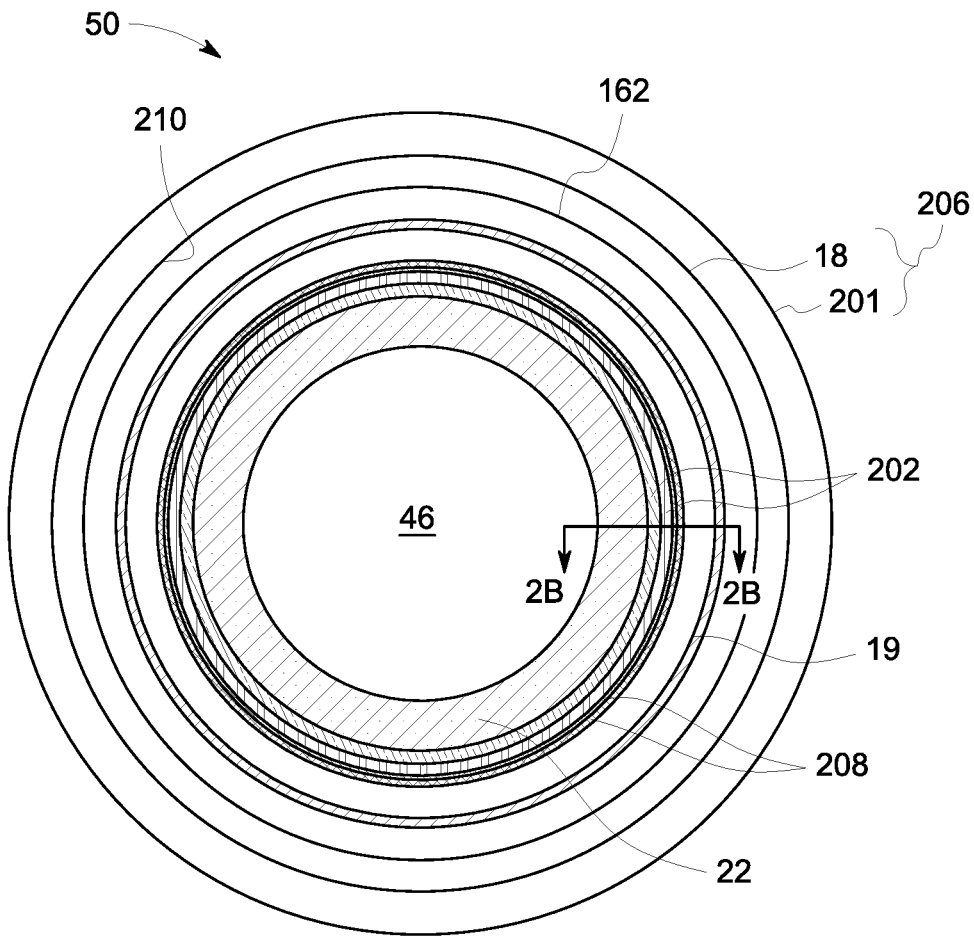
FIG. 2A is a schematic diagram of an exemplary magnet assembly of the system shown in FIG. 1.
Figure 2B:
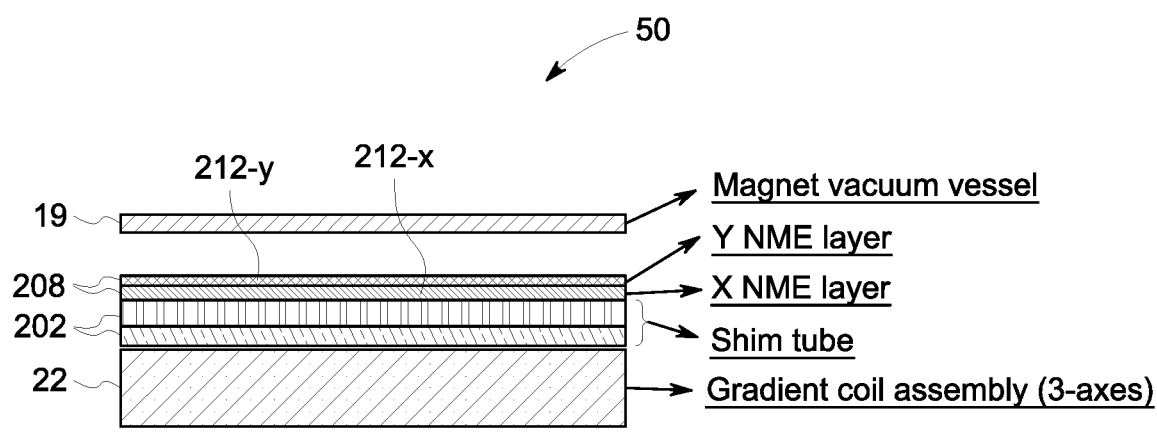
FIG. 2B is a partial sectional view of the magnet assembly shown in FIG. 2A along cross sectional line 2B-2B.

FIGS. 2A and 2B are schematic diagrams of exemplary magnet assembly 50. FIG. 2B is a partial cross sectional view of magnet assembly 50 along cross-sectional line 2B-2B. Body RF coil 24 is not depicted in FIGS. 2A and 2B. In the exemplary embodiment, magnet assembly 50 includes gradient coil assembly 22 and main magnet assembly 12. Magnet assembly 50 may include a shim tube 202. Shim tube 202 may be attached to gradient coil assembly 22. In some embodiments, shim tube 202 may be formed integrally with gradient coil assembly 22. Alternatively, shim tube 202 is attached to main magnet assembly 12, such as the inner backing of magnet vacuum vessel 19.

In the exemplary embodiment, main magnet assembly 12 includes magnet vacuum vessel 19, thermal shield assembly 16, a cryostat vessel 18, main magnet 14 including magnet wires 201. For simplicity, outer thermal shield member 164 and the outer layer of magnet vacuum vessel 19 are not depicted in FIGS. 2A or 2B. In superconducting main magnet assembly 12, magnet wires 201 are kept at the superconducting temperature of the superconducting metal in magnet wires 201. The superconducting temperature is typically 4 Kelvin (K). The region in main magnet assembly 12 where the temperature is maintained at the superconducting temperature such that superconducting of electrical currents occurs is referred to as a superconducting region 206. In FIG. 2A, main magnet 14 and cryostat vessel 18 are in the superconducting region 206. The temperature of inner thermal shield member 162 may be at 50 K. For a superconducting magnet, the temperature at superconducting region 206 should be kept at or below the superconducting temperature. A cold head (not shown) may be used to maintain the temperature of in superconducting region 206. Because the low temperature of superconducting region 206, the power of the cold head in cooling is limited.

In the exemplary embodiment, magnet assembly 50 includes a shield assembly 208. Shield assembly 208 is positioned between gradient coil assembly 22 and superconducting region 206. Shield assembly 208 may be attached to a structure of magnet assembly 50 in the region between gradient coil assembly 22 and superconducting region 206. For example, shield assembly 208 is attached to gradient coil assembly 22, shim tube 202, an inner layer of magnet vacuum vessel 19, inner thermal shield member 162, or an interior side 210 of cryostat vessel 18. Interior side 210 of cryostat vessel 18 is the innermost side of cryostat vessel 18 that faces bore 46. Shield assembly 208 is used to reduce heating to main magnet 14 caused by motional eddy currents.

Electrical currents are induced in nearby conductors by a changing magnetic field. Because MR uses rapidly changing magnetic fields to generate and spatially define the signal, eddy currents are always produced whenever scanning is performed. Such eddy currents are referred to as induced eddy currents. The source of the changing magnetic fields are from the gradient coils, mostly, or RF coils. The conductive material in which eddy currents are induced may be any electrically conductive components of MR system 10, such as coils, shields, tubes, wires, or housing.

During scanning, currents may be rapidly switched, especially in gradient coils, to sample through the k-space. Rapid switching of electrical currents in a magnetic field generates Lorentz force, causing the structures in magnet assembly 50 to vibrate. The vibrations or movement of the structures in magnet assembly 50 produce currents. Such currents are referred to as motional eddy currents.

The heating effects of induced eddy currents on main magnet 14 are manageable. The electromagnetic field generated by induced eddy currents are opposite from and cancel at least partially the source electromagnetic field which induces the eddy currents. The layers of conductive materials between gradient coil assembly 22 and superconducting region 206 act as shields, reducing induced eddy currents and effects of eddy currents on main magnet 14. Joules heating from remaining induced currents is managed by the cold head. Induced eddy currents may also be reduced by active shielding or through shielded configuration, where the fringing magnetic field to structures of magnet assembly 50 that induces eddy currents is cancelled or reduced.

Compared to induced eddy currents, motional eddy currents have a relatively high magnitude and are difficult to be reduced. Motional eddy currents may have much greater magnitude than induced eddy currents. At certain vibration frequencies, motional eddy currents are hundreds times greater than induced eddy currents. Joules heating from motional eddy currents is beyond the cooling power of the cold head, causing the cryogenic fluid to evaporate in order to maintain the temperature of superconducting region 206. Cryogenic fluid such as helium is nonrecyclable natural resource and costly to replenish. Motional eddy currents may even impose quench risks when the motional eddy currents are at the level that evaporation of cryogenic fluid is not enough to maintain the temperature of superconducting region 206 and superconductivity is lost, causing rapid boiling off of the cryogenic fluid and decommission of the MR system.

To reduce motional eddy currents, currents to gradient coils may be reduced. Because motional eddy currents are caused by vibration of structures in magnet assembly 50, at resonance frequencies of the structures, motional eddy currents are higher than at other frequencies. Pulse sequences may be redesigned or restricted to avoid motional eddy currents at those frequencies, placing limitations to the performance of MR system 10.

Another known method of reducing motional eddy currents is to minimize the vibrations such as by stiffening the structures or adding stiffening structures. This method faces several challenges. Firstly, vibration is unavoidable because material does not have an infinite stiffness. Secondly, increasing stiffness is costly and magnet assembly lacks internal space to allow the increase of stiffness of the structures. For example, to increase the stiffness, the structures may be thickened, which increases the bore size of magnet assembly 50, drastically increasing the cost because the superconducting wires are expensive and increase in the bore size would inevitably increases the length of magnet wires.

The systems, assemblies, and methods described herein overcome the above described problems in known systems and methods. Shield assembly 208 does not increase or requires minimal increase of the bore size of magnet assembly 50. The thickness of shield assembly 208 may be as thin as 0.1 mm. Shield assembly 208 may be placed in any gap between structures of magnet assembly 50 or may be positioned on existing structures of magnet assemblies. Therefore, systems including shield assemblies are not cost prohibitive. Because shield assembly 208 allows structures to vibrate, limits related to vibrations such as currents of gradients coils or pulse sequences are not needed to be imposed, enhancing the performance of MR system 10.

Figure 3A:
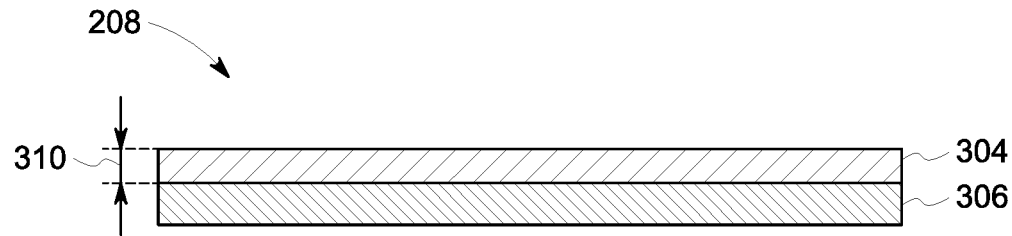
FIG. 3A is a schematic diagram showing a cross section of an exemplary shield assembly for the magnet assembly shown in FIGS. 2A and 2B.
Figure 3B:
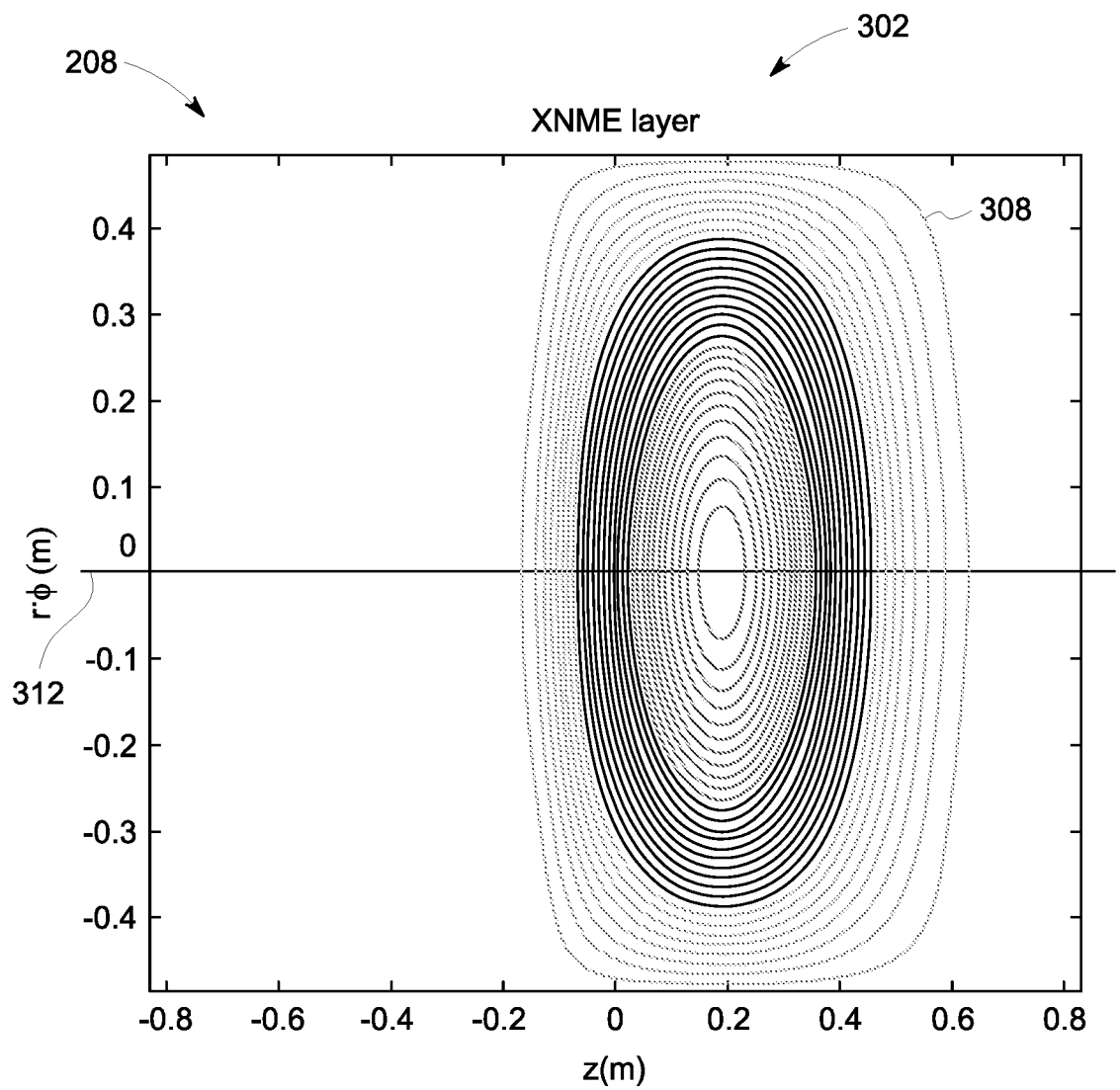
FIG. 3B shows an exemplary pattern of the shield assembly shown in FIG. 3A.

FIGS. 3A and 3B show exemplary shield assembly 208. FIG. 3A is schematic diagram of a cross section of shield assembly 208. FIG. 3B shows a pattern 302 of shield assembly 208. In the exemplary embodiment, shield assembly 208 includes a conductive layer 304 and an insulating layer 306. Insulating layer 306 is fabricated from electrically non-conductive material, such as plastic or fiberglass. Insulating layer 306 provides structural support and insulation for conductive layer 304.

In the exemplary embodiment, conductive layer 304 is fabricated from electrically conductive material, such as copper, silver, or aluminum. Conductive layer 304 includes grooves 308 through conductive layer 304, exposing insulating layer 306. Grooves 308 restrict current flowing directions. Grooves 308 are designed such that at least parts of grooves 308 are oriented orthogonally to a direction of motional eddy currents. As a result, grooves are designed or configured such that induced eddy currents flow in conductive layer 304 while motional eddy currents are blocked by grooves.

Conductive layer 304 may be attached or affixed with insulating layer 306 by a bonding agent (not shown) such as adhesives. Conductive layer 304 may be plated with insulating layer using metal plating. Other bonding methods may be used to bond conductive layer 304 with insulating layer 306. The bonding of conductive layer 304 and insulating layer 306 may be performed before forming grooves 308, where conductive layer 304 and insulating layer 306 are bonded and then grooves are cut according to a pattern 302. Alternatively, the bonding of conductive layer 304 and insulating layer 306 may be performed after forming grooves 308, where conductive layer 304 with pattern 302 is bonded with insulating layer 306. In some embodiments, grooves are formed while conductive layer 304 is being bonded with insulating layer 306. For example, conductive layer 304 is deposited on insulating layer 306 according to pattern 302.

In FIG. 3B, z is the direction of main magnetic field, and r·φ is the distance along the circumference of shield assembly 208 from the central z axis of bore 46 extending from the iso-center of bore 46 (see FIG. 2A). Shield assembly 208 may be pliable such that shield assembly 208 is formed as a sheet and then is folded and curled into a desired shape such as a cylinder. Shield assembly 208 may be formed into a cylinder by curling shield assembly 208 about a center z line 312. Shield assembly 208 may be radially placed inside magnet assembly 50. Shield assembly 208 may be pre-assembled and then being assembled in the magnet assembly 50 by folding and attaching shield assembly 208 to magnet assembly 50. Alternatively, shield assembly 208 may be assembled with magnet assembly 50. For example, conductive layer 304 and/or insulating layer 306 may be formed in magnet assembly 50 and then grooves 308 in pattern 302 are cut in conductive layer 304. In another example, conductive layer 304 is assembled by additive manufacturing process, where conductive layer 304 is deposited on insulating layer 306 or an insulating layer of magnet assembly 50 with grooves in pattern 302.

In operation, during scanning, induced eddy currents flow on conductive layer 304 while motional eddy currents are blocked. Induced eddy currents flowing in shield assembly 208 generate electromagnetic fields, which cancel at least partially the source of induced eddy currents such as magnetic field from gradient coils. Shield assembly 208 therefore performs shielding function to induced eddy currents, reducing induced eddy currents in structures beyond shield assembly 208, such as main magnet 14. In the meantime, because grooves 308 are oriented orthogonally to a direction of motional eddy currents, motional eddy currents are blocked by shield assembly 208.

Because conductive layer 304 provides a conductive medium for induced eddy currents to flow, material of conductive layer 304 is chosen to have relatively high electrical conductivity such as copper, silver, copper alloy, or silver alloy. Conductive layer 304 has a thickness 310 to allow induced eddy currents to flow through. In some embodiments, the thickness 310 is close to or larger than the skin depth of induced eddy currents. Skin depth of copper at room temperature is approximately 2 mm. The thickness of conductive layer may be approximately 2 mm or greater. In other embodiments, despite skin effects, conductive layer 304 provides reasonable conductivity to induced eddy currents because induced eddy currents have already been reduced by other structures and are not significant. The thickness of conductive layer 304 may be less than the skin depth of the conductive material of conductive layer 304, such as 0.1 mm or greater.

Conductive layer 304 may be configured in various ways. For example, in a parallel-loop configuration, the layer 304 may include disjoint loops, where the disjoint loops are not electrically connected for current to follow between individual loops. In another example, in a series-loop configuration, conductive layer 304 may include a continuous multi-turn path, along which induced eddy currents flow. In one more example, conductive layer 304 may include disjoint loops and multi-turn paths.

In the exemplary embodiment, shield assembly 208 includes an x shield layer 212-$x$, a y shield layer 212-$y$, and a z shield layer (not shown) (see FIG. 2B). In FIGS. 2A and 2B, x shield layer 212-$x$ is positioned inside y shield layer 214 as an example. x, y, z shield layers may be in any configuration relative to one another, where x, y, z shield layers may be in any order from the innermost layer to the outermost layer. x, y, z shield layers may be positioned separately from one another, where x, y, z shield layers are not next to one another. Each of x, y, or z shield layer 212 includes conductive layer 304 and may or may not include insulating layer 306. Patterns 302 on x, y, and z shield layers 212 are different from one another because pattern 302 is generated based on motional eddy currents caused by corresponding x, y, or z gradient coils. Typically, motional eddy currents from x or y gradients generated by x or y gradient coils are much more significant than z gradients generated by the z gradient coil. In some embodiments, shield assembly 208 may only include an x-shield layer and a y shield layer, without including the z shield layer. In other embodiments, shield assembly 208 includes any combination of x, y, and z shield layers.

Figure 4A:
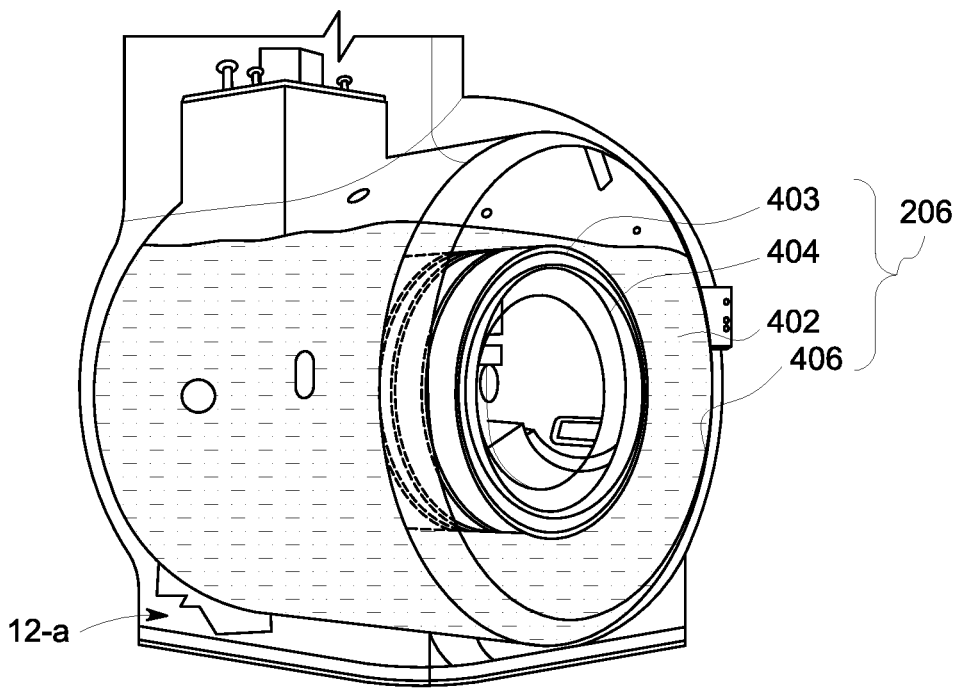
FIG. 4A is a schematic diagram of a superconducting main magnet assembly using helium-bath cooling.
Figure 4B:
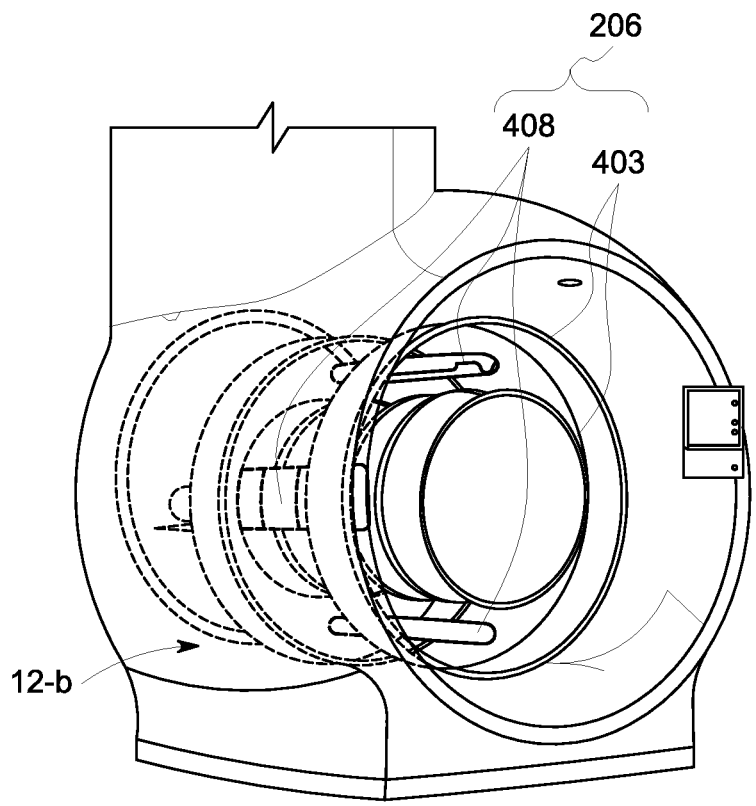
FIG. 4B is a schematic diagram of a superconducting main magnet assembly using conduction cooling.

FIGS. 4A and 4B show superconducting region 206 in two different types of superconducting main magnet assembly 12-$a$, 12-$b$. Superconducting main magnet assembly 12-$a$ typically uses helium bath mechanism (FIG. 4A). Cryostat vessel 18 includes liquid helium 402. Magnet windings 403 of main magnet 14 are bathed in liquid helium 402. The superconducting region 206 of main magnet assembly 12-$a$ includes the region enclosed by cryostat vessel 18, which starts from inner vessel layer 404 to outer vessel layer 406 and includes magnet windings 403, liquid helium 402, and cryostat vessel 18. Compared to main magnet assembly 12-$a$, main magnet assembly 12-$b$ uses conduction cooling, where magnet windings 403 are cooled and maintained at superconducting temperature via liquid helium being circulated in cooling tubes 408 (FIG. 4B). Cooling tubes 408 are thermally connected with magnet windings 403. Superconducting region 206 in main magnet assembly 12-$b$ includes magnet windings 403 and cooling tubes 408.

Figure 5:
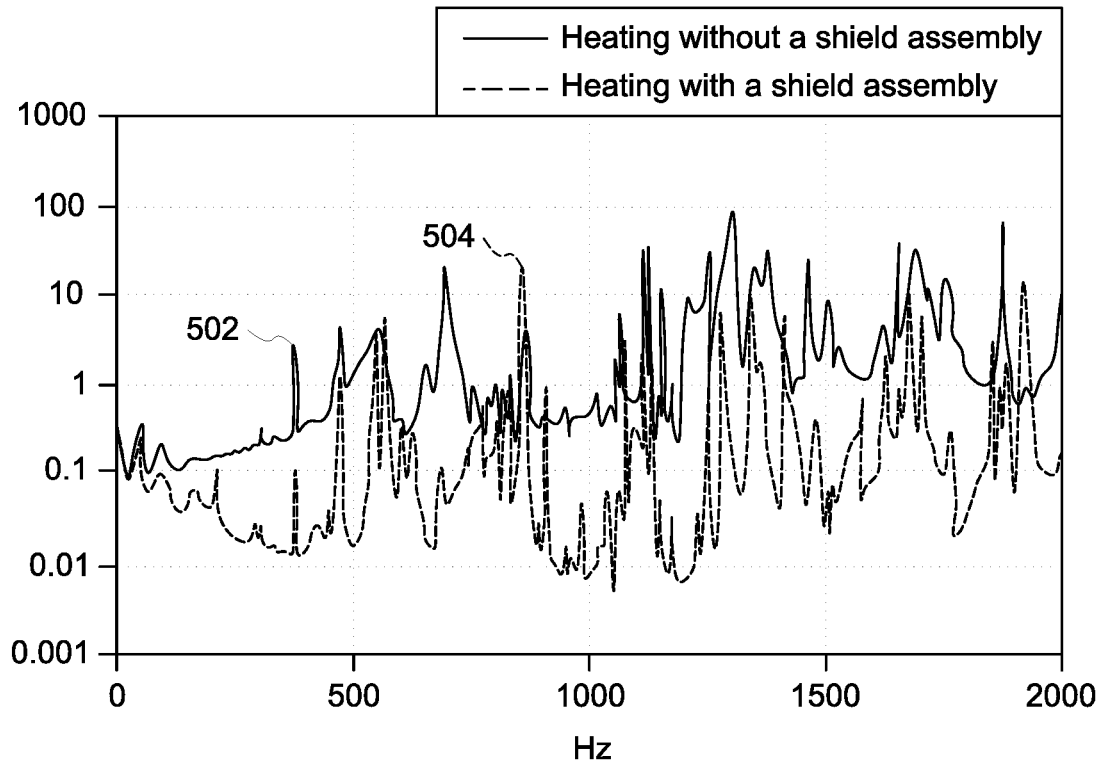
FIG. 5 is a comparison of motional eddy current heating of an MR system without and with the systems and methods described herein.

FIG. 5 shows simulation results of gradient-induced magnet heating in an MR system without (curve 502) and with (curve 504) systems and methods described herein. Curve 502 shows heating without including shield assembly 208 in MR system 10. Curve 504 shows heating when shield assembly 208 is included in MR system 10. The y axis is the power of heating in an arbitrary unit and in the logarithmic scale. As shown, including shield assembly 208 significantly reduces heating. At some frequencies, heating is reduced by an order of magnitude of 2, where heating is reduced by hundreds times. Heating is reduced to a range manageable by the cooling power of the cold head, significantly reducing the risks of magnet quench.

Figure 6:
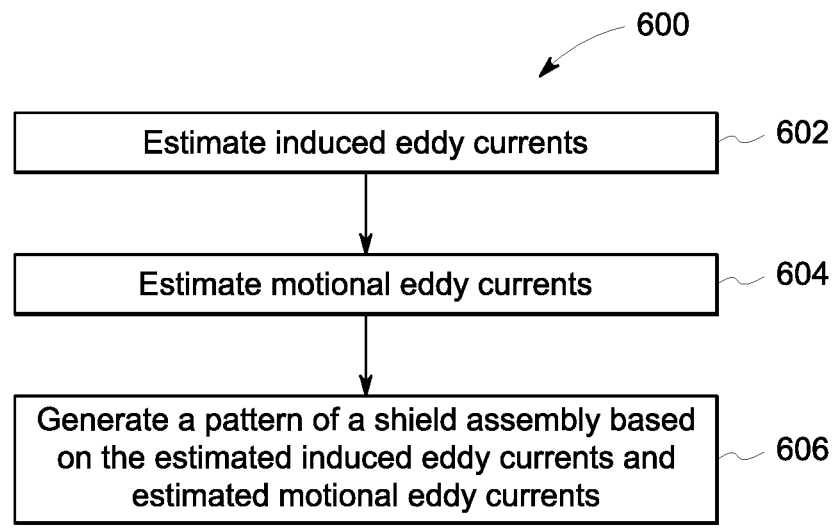
FIG. 6 is a flow chart of an exemplary method of assembling the shield assembly shown in FIGS. 1-3B.

FIG. 6 is an exemplary method 600 of assembling a shield assembly. In the exemplary embodiment, method 600 includes estimating 602 induced eddy currents. Induced eddy currents may be estimated by simulation using gradient field maps and/or pulse sequences of MR system 10. A pulse sequence is a sequence of RF pulses, gradient pulses, and data acquisition applied by MR system 10 in acquiring MR signals. Method 600 further includes estimating 604 motional eddy currents. For example, for a given gradient field map and pulse sequence, the Lorentz force from the induced eddy current is estimated based on the induced eddy current and the magnetic field. The motion or vibration of the structures of magnet assembly 50 is estimated based on the Lorentz force, the mass, and the stiffness of the structures. Finally, motional eddy currents $J_{motional\_eddy}$ may be estimated based on the vibration according to $J_{motional\_eddy} = \sigma \vec{v} \times \vec{B}$, where $\sigma$ is the electric conductivity of the material, $\vec{v}$ is the velocity, and $\vec{B}$ is the magnetic field of magnet assembly 50. Because eddy currents are largely caused by gradient pulses, estimation of motional eddy current and/or induced eddy currents may be only based on the gradient pulses of pulse sequences.

In the exemplary embodiment, method 600 further includes generating 606 a pattern of a shield assembly based on the estimated motional eddy currents and/or the estimated induced eddy currents. Pattern 302 is designed such that at least parts of grooves 308 are oriented in directions orthogonal to a direction of eddy currents, thereby reducing or limiting the flow of motional eddy currents. Grooves 308 may or may not follow the directions of induced eddy currents. At a given position at conductive layer, the current vectors of induced eddy currents and current vectors of motional eddy currents typically orient differently. As a result, conductive layer 304 having a pattern as designed above blocks motional eddy currents, as well as facilitating the flow of induced eddy currents. Shield assembly may include x shield layer, y shield layer, z shield layer, or any combination thereof. The x shield layer is designed based on the x gradient pulses in a pulse sequence to block motional eddy currents and facilitate the flowing of induced eddy currents caused by x gradient coils. Similarly, the y shield layer is designed based on the y gradient pulses in a pulse sequence to block motional eddy currents and facilitate the flowing of induced eddy currents caused by y gradient coils. The z shield layer is designed based on the z gradient pulses to block motional eddy currents and facilitate the flowing of induced eddy currents caused by z gradient coils. Gradients for different pulse sequence vary. In designing pattern 302, pattern 302 may be optimized using a criterion, such as blocking motional eddy currents for a pulse sequence that causes most severe eddy currents such as echo planar imaging (EPI) sequences, or blocking motional eddy currents at frequencies that correspond to resonance frequencies of the structures of magnet assembly 50 (see FIG. 5).

Once pattern 302 is designed, grooves 308 are cut according to pattern 302. Grooves 308 may be cut before or after conductive layer 304 is assembled with insulating layer 306 or an insulating layer of magnet assembly 50. After shield assembly 208 is assembled, shield assembly 208 is installed in magnet assembly 50. Shield assembly 208 may be attached to structures between gradient coil assembly 22 and a superconducting region 206. Shield assembly 208 may be a stand-alone structure that is positioned between gradient coil assembly 22 and superconducting region 206 but is not attached to other structures. Shield assembly 208 may be directly assembled in magnet assembly 50.

Figure 7:
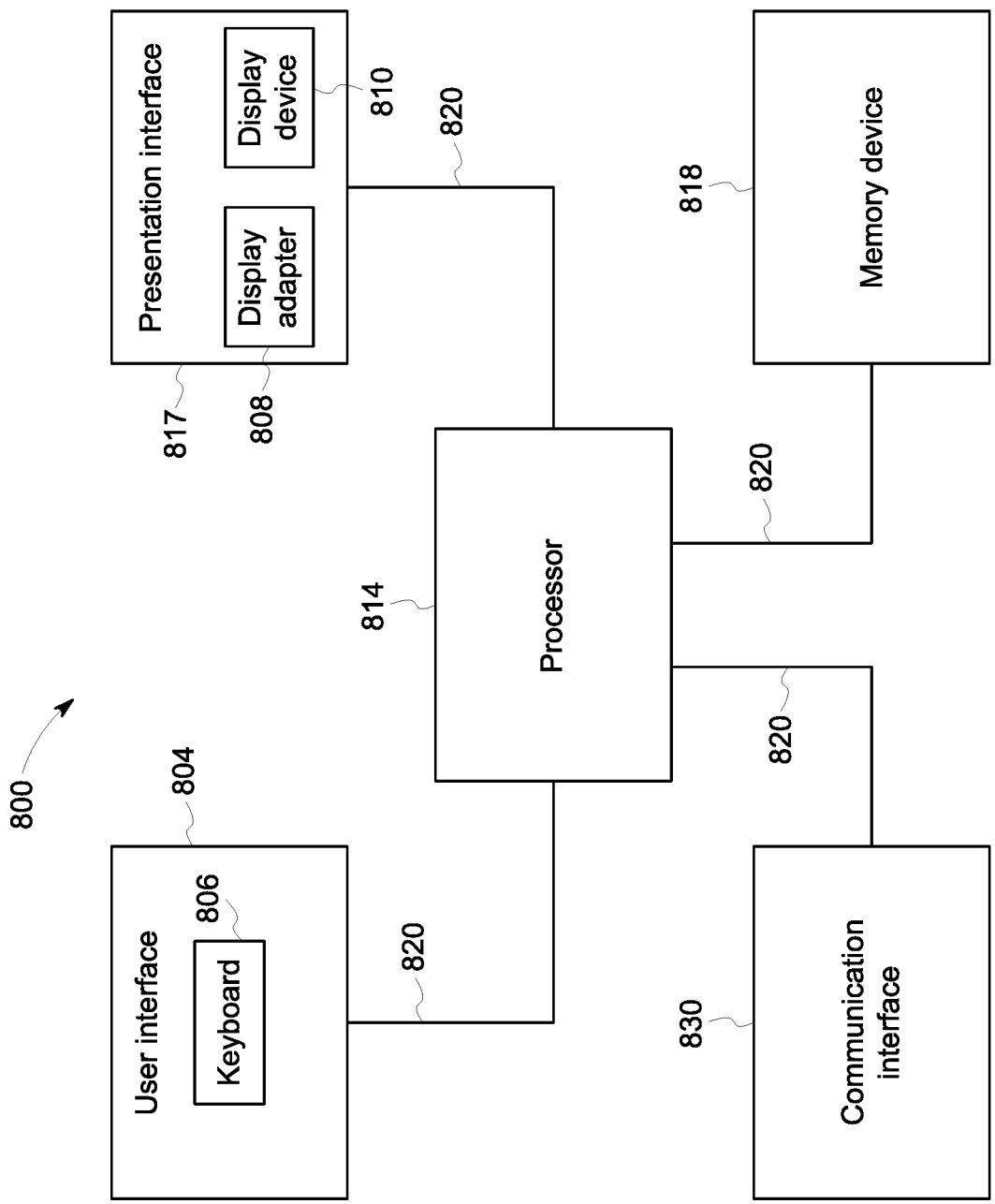
FIG. 7 is a block diagram of an exemplary computing device.

Methods 600 or part of methods 600 may be implemented with any suitable computing device 800 and software implemented therein. FIG. 7 is a block diagram of an exemplary computing device 800. In the exemplary embodiment, computing device 800 includes a user interface 804 that receives at least one input from a user. User interface 804 may include a keyboard 806 that enables the user to input pertinent information. User interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 817 that presents information, such as input events and/or validation results, to the user. Presentation interface 817 may also include a display adapter 808 that is coupled to at least one display device 810. More specifically, in the exemplary embodiment, display device 810 may be a visual display device, such as a cathode ray tube (CRT), a liquid crystal display (LCD), a light-emitting diode (LED) display, and/or an "electronic ink" display. Alternatively, presentation interface 817 may include an audio output device (e.g., an audio adapter and/or a speaker) and/or a printer.

Computing device 800 also includes a processor 814 and a memory device 818. Processor 814 is coupled to user interface 804, presentation interface 817, and memory device 818 via a system bus 820. In the exemplary embodiment, processor 814 communicates with the user, such as by prompting the user via presentation interface 817 and/or by receiving user inputs via user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, memory device 818 includes one or more devices that enable information, such as executable instructions and/or other data, to be stored and retrieved. Moreover, memory device 818 includes one or more computer readable media, such as, without limitation, dynamic random access memory (DRAM), static random access memory (SRAM), a solid state disk, and/or a hard disk. In the exemplary embodiment, memory device 818 stores, without limitation, application source code, application object code, configuration data, additional input events, application states, assertion statements, validation results, and/or any other type of data. Computing device 800, in the exemplary embodiment, may also include a communication interface 830 that is coupled to processor 814 via system bus 820. Moreover, communication interface 830 is communicatively coupled to data acquisition devices.

In the exemplary embodiment, processor 814 may be programmed by encoding an operation using one or more executable instructions and providing the executable instructions in memory device 818. In the exemplary embodiment, processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Figure 8:
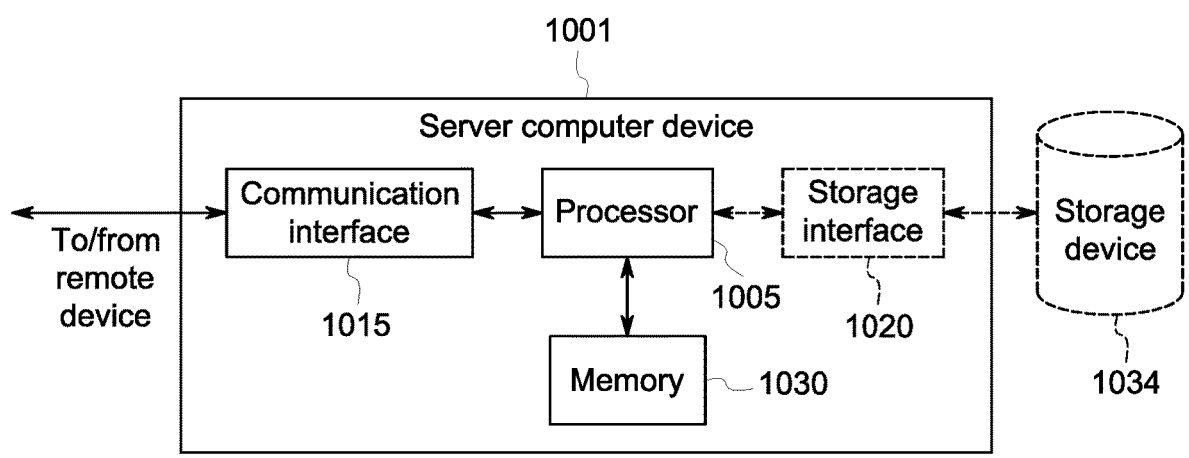
FIG. 8 is a block diagram of an exemplary server computing device.

FIG. 8 illustrates an exemplary configuration of a server computer device 1001, with which methods 600 or part of methods 600 may be implemented. Server computer device 1001 also includes a processor 1005 for executing instructions. Instructions may be stored in a memory area 1030, for example. Processor 1005 may include one or more processing units (e.g., in a multi-core configuration).

Processor 1005 is operatively coupled to a communication interface 1015 such that server computer device 1001 is capable of communicating with a remote device or another server computer device 1001. For example, communication interface 1015 may receive data from computing device 800 or controller 30, via the Internet.

Processor 1005 may also be operatively coupled to a storage device 1034. Storage device 1034 is any computer-operated hardware suitable for storing and/or retrieving data, such as, but not limited to, wavelength changes, temperatures, and strain. In some embodiments, storage device 1034 is integrated in server computer device 1001. For example, server computer device 1001 may include one or more hard disk drives as storage device 1034. In other embodiments, storage device 1034 is external to server computer device 1001 and may be accessed by a plurality of server computer devices 1001. For example, storage device 1034 may include multiple storage units such as hard disks and/or solid state disks in a redundant array of inexpensive disks (RAID) configuration. storage device 1034 may include a storage area network (SAN) and/or a network attached storage (NAS) system.

In some embodiments, processor 1005 is operatively coupled to storage device 1034 via a storage interface 1020. Storage interface 1020 is any component capable of providing processor 1005 with access to storage device 1034. Storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 1005 with access to storage device 1034.

At least one technical effect of the systems and methods described herein includes (a) reduction of motional eddy currents via shield assemblies; (b) shield assemblies providing shielding for induced eddy currents while blocking motional eddy currents, thereby reducing risks in magnet heating and quench; (c) shield assemblies including patterned grooves that provide paths for induced eddy currents to flow while blocking motional eddy currents, and (d) methods of designing patterns in shield assemblies.

Exemplary embodiments of systems and methods of motional eddy current reduction are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) system, comprising:
   a main magnet assembly configured to generate a polarizing magnetic field;
   a gradient coil assembly including a plurality of gradient coils configured to apply at least one gradient field to the polarizing magnetic field; and
   a shield assembly positioned between the main magnet assembly and the gradient coil assembly, wherein the shield assembly comprises:
   an insulating layer; and
   a conductive layer fabricated with an electrically conductive material and defining grooves positioned through the conductive layer, wherein the grooves are configured to block motional eddy currents caused by actions of the polarizing magnetic field and the at least one gradient field when the at least one gradient field is applied,
   wherein the conductive layer is attached with the insulating layer, the grooves exposing the insulating layer.

2. The MR system of claim 1, wherein at least a part of the grooves is oriented in a direction orthogonal to a direction of the motional eddy currents.

3. The MR system of claim 1, wherein the conductive layer is configured to conduct induced eddy currents induced by the gradient coil assembly when the at least one gradient field is applied.

4. The MR system of claim 1, wherein the shield assembly includes at least one of an x shield layer, a y shield layer, or a z shield layer, and the x shield layer, the y shield layer, or the z shield layer configured to block motional eddy currents caused by an application of the at least one gradient field via an x gradient coil, a y gradient coil, or a z gradient coil, respectively.

5. The MR system of claim 1, wherein the shield assembly includes at least one of an x shield layer or a y shield layer, and the x shield layer or they shield layer configured to block motional eddy currents caused by an application of the at least one gradient field via an x gradient coil or a y gradient coil, respectively.

6. The MR system of claim 1, wherein the main magnet assembly includes a superconducting main magnet.

7. The MR system of claim 6, wherein the shield assembly is positioned between the gradient coil assembly and a superconducting region of the main magnet assembly.

8. The MR system of claim 1, wherein the shield assembly is attached with the gradient coil assembly.

9. The MR system of the claim 1, wherein the shield assembly is attached with the main magnet assembly.

10. A shield assembly of a magnetic resonance (MR) system, comprising:
    an insulating layer; and
    a conductive layer fabricated with an electrically conductive material and defining grooves positioned through the conductive layer, wherein the grooves are configured to block motional eddy currents generated by the MR system,
    wherein the conductive layer is attached with the insulating layer, the grooves exposing the insulating layer, and
    wherein the conductive layer is configured to facilitate flow of induced eddy currents caused by changing magnetic fields in the MR system.

11. The shield assembly of claim 10, wherein at least a part of the grooves is oriented in a direction orthogonal to a direction of the motional eddy currents.

12. The shield assembly of claim 10, wherein the conductive layer is configured to conduct induced eddy currents induced by the MR system.

13. The shield assembly of claim 10, wherein the shield assembly includes at least one of an x shield layer, a y shield layer, or a z shield layer, and the x shield layer, the y shield layer, or the z shield layer configured to block motional eddy currents caused by an application of gradient field via an x gradient coil, a y gradient coil, or a z gradient coil of the MR system, respectively.

14. The shield assembly of claim 10, wherein the shield assembly includes at least one of an x shield layer or a y shield layer, and the x shield layer or they shield layer configured to block motional eddy currents caused by an application of gradient field via an x gradient coil or a y gradient coil of the MR system, respectively.

15. The shield assembly of claim 10, wherein the conductive layer has a thickness of 2 millimeter (mm) or less.

16. A method of assembling a shield assembly of a magnetic resonance (MR) system, comprising:
    providing an insulating layer;
    providing a conductive layer fabricated with an electrically conductive material and defining grooves positioned through the conductive layer, wherein the grooves are configured to block motional eddy currents generated by the MR system; and
    attaching the conductive layer with the insulating layer, wherein the grooves expose the insulating layer,
    wherein the conductive layer is configured to facilitate flow of induced eddy currents caused by changing magnetic fields in the MR system.

17. The method of claim 16, wherein providing a conductive layer further comprises:
    estimating the motional eddy currents generated by the MR system; and
    generating a pattern of the grooves on the conductive layer based on the estimated motional eddy currents.

18. The method of claim 17, wherein generating a pattern further comprises:
    forming the grooves such that at least a part of the grooves is oriented in a direction orthogonal to a direction of the motional eddy currents.

19. The method of claim 16, wherein providing a conductive layer further comprises:

estimating induced eddy currents induced by the MR system; and generating a pattern of the grooves on the conductive layer based on the motional eddy currents and the induced eddy currents by forming the grooves configured to facilitate flowing of the induced eddy currents.

20. The method of claim 16, further comprising:

attaching the shield assembly with at least one of a main magnet assembly or a gradient coil assembly of the MR system.

* * * * *